(12) United States Patent
Lee et al.

(10) Patent No.: US 11,019,701 B2
(45) Date of Patent: *May 25, 2021

(54) LED DISPLAY STRUCTURES AND FABRICATION OF SAME

(71) Applicant: LUMIODE, INC., Bronx, NY (US)

(72) Inventors: Vincent Lee, New York, NY (US); Ioannis Kymissis, New York, NY (US); Brian Tull, New York, NY (US)

(73) Assignee: LUMIODE, INC., New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/870,540

(22) Filed: May 8, 2020

(65) Prior Publication Data

US 2020/0305253 A1 Sep. 24, 2020

Related U.S. Application Data

(63) Continuation of application No. 16/419,658, filed on May 22, 2019, now Pat. No. 10,652,963.

(Continued)

(51) Int. Cl.
  *H01L 33/06* (2010.01)
  *H01L 33/18* (2010.01)
  *H05B 45/44* (2020.01)

(52) U.S. Cl.
  CPC ............. *H05B 45/44* (2020.01); *H01L 33/06* (2013.01); *H01L 33/18* (2013.01)

(58) Field of Classification Search
  CPC ......... H01L 33/00; H01L 33/02; H01L 33/06; H01L 33/18; H01L 33/36; H01L 33/62;

(Continued)

(56) References Cited

U.S. PATENT DOCUMENTS 5,475,397 A 12/1995 Saidi
5,654,734 A 8/1997 Orlen et al.
(Continued)

FOREIGN PATENT DOCUMENTS

EP 2835802 A1 2/2015
JP 2006196712 A 7/2006
(Continued)

OTHER PUBLICATIONS

International Search Report and Written Opinion for PCT/US2019/033554 dated Sep. 11, 2019 in 13 pages.

(Continued)

*Primary Examiner* — Thai Pham
(74) *Attorney, Agent, or Firm* — Cozen O'Connor

(57) ABSTRACT

LED structures (e.g., LED arrays) and fabrication methods can reduce or even eliminate deep etching, and associated defect formation, proximate sites of individual LEDs. Such approaches can achieve desired electrical isolation without deep etching, provide a high conductivity current spreading layer, and, or reduce losses otherwise associated with conventional fabrication approaches. Some implementations advantageously lift off or separate an insulating substrate from a wafer to expose a bottom surface of the epitaxial LED layer and forms a backside contact (e.g., ground plane) overlying the bottom surface. Other implementations isolate deep etching away from sensitive regions and locate the backside contact on a top surface of the epitaxial LED layer. Some implementations form light extraction features (e.g., photonic crystals) on the exposed bottom surface. The top surface of the epitaxial LED layer may be undoped to improve electrical isolation. The bottom surface of may be shallow etched to improve light extraction.

19 Claims, 26 Drawing Sheets

Related U.S. Application Data

(60) Provisional application No. 62/676,172, filed on May 24, 2018.

(58) Field of Classification Search
CPC ......... H01L 27/00; H01L 27/15; H01L 21/70; H05B 33/08; H05B 33/0824; H05B 45/44
See application file for complete search history.

(56) References Cited

U.S. PATENT DOCUMENTS

| | | | |
|---|---|---|---|
| 7,928,465 | B2 | 4/2011 | Lee et al. |
| 8,493,000 | B2 | 7/2013 | Jungwirth |
| 8,493,309 | B2 | 7/2013 | Tobita |
| 8,664,686 | B2 | 3/2014 | Shieh et al. |
| 8,681,185 | B2 | 3/2014 | Guncer |
| 8,907,591 | B2 | 12/2014 | Jungwirth |
| 9,041,034 | B2 | 5/2015 | Mao et al. |
| 9,147,812 | B2 | 9/2015 | Andrews |
| 9,159,700 | B2 | 10/2015 | Sakariya et al. |
| 9,196,606 | B2 | 11/2015 | Oraw |
| 9,203,005 | B2 | 12/2015 | Lee et al. |
| 9,240,397 | B2 * | 1/2016 | Bibl ................. H01L 33/60 |
| 9,515,238 | B2 | 12/2016 | Maaskant et al. |
| 9,530,949 | B2 | 12/2016 | Lee et al. |
| 9,548,332 | B2 | 1/2017 | Hu et al. |
| 9,557,954 | B2 | 1/2017 | Jepsen et al. |
| 9,558,721 | B2 | 1/2017 | Sakariya et al. |
| 9,570,427 | B2 | 2/2017 | Bibl et al. |
| 9,812,494 | B2 | 11/2017 | Percival |
| 2010/0164854 | A1 | 7/2010 | Kim et al. |
| 2010/0317132 | A1 | 12/2010 | Rogers et al. |
| 2010/0321640 | A1 | 12/2010 | Yeh et al. |
| 2012/0025242 | A1 * | 2/2012 | Zeng ................. H01L 33/486 257/98 |
| 2012/0286240 | A1 * | 11/2012 | Yu ................. H01L 24/24 257/13 |
| 2014/0103391 | A1 | 4/2014 | Haruta et al. |
| 2014/0145204 | A1 | 5/2014 | Xu et al. |
| 2014/0368561 | A1 | 12/2014 | Liao et al. |
| 2015/0279902 | A1 | 10/2015 | Von Malm et al. |
| 2015/0332635 | A1 | 11/2015 | Lau et al. |
| 2016/0308103 | A1 | 10/2016 | Hu et al. |
| 2017/0025399 | A1 | 1/2017 | Takeya et al. |
| 2017/0179097 | A1 | 6/2017 | Zhang et al. |
| 2017/0179192 | A1 | 6/2017 | Zhang et al. |
| 2017/0271557 | A1 | 9/2017 | Brennan et al. |
| 2017/0287399 | A1 | 10/2017 | Ahmed et al. |
| 2017/0294479 | A1 | 10/2017 | Cha et al. |
| 2017/0301838 | A1 | 10/2017 | Camras et al. |
| 2018/0014372 | A1 | 1/2018 | Chen et al. |
| 2018/0047782 | A1 | 2/2018 | Percival |
| 2018/0090058 | A1 | 3/2018 | Chen et al. |
| 2018/0114800 | A1 * | 4/2018 | Pan ................. H01L 27/0694 |
| 2018/0219005 | A1 | 8/2018 | Bedell et al. |
| 2018/0269191 | A1 | 9/2018 | England et al. |
| 2018/0277524 | A1 | 9/2018 | Moon et al. |
| 2018/0331085 | A1 | 11/2018 | Chang et al. |
| 2019/0326348 | A1 * | 10/2019 | Im ................. H01L 25/0753 |

FOREIGN PATENT DOCUMENTS

| | | |
|---|---|---|
| KR | 1020140077120 | 6/2014 |
| KR | 20170098882 A | 8/2017 |
| WO | 2014193102 A1 | 12/2014 |
| WO | 2017149521 A1 | 9/2017 |

OTHER PUBLICATIONS

International Search Report and Written Opinion for PCT/US2019/066888 dated Apr. 14, 2020, 8 pages.
International Search Report and Written Opinion for PCT/US2019/066940 dated Apr. 29, 2020, 15 pages.
International Search Report and Written Opinion for PCT/US2019/067207 dated Apr. 22, 2020, 9 pages.
"Micro-LED Arrays: Tomorrow's smart lighting and display technology", Brochure; Leti, technology research institute; Apr. 2017.
Cok, Ronald S., "Inorganic light-emitting diode displays using micro-transfer printing", Journal of the Society for Information Display 25(10), pp. 589-609; 2017.
Fan, Ching-Lin , et al., "Display Technology Letters: Novel LTPS-TFT Pixel Circuit with OLED Luminance Compensation for 3D AMOLED Displays", Journal of Display Technology, vol. 12, No. 5, pp. 425-428; May 2016.
Herrnsdorf, Johannes , et al., "Active-Matrix GaN Micro Light-Emitting Diode Display With Unprecedented Brightness", IEEE Transactions on Electron Devices, vol. 62, No. 6, pp. 1918-1925; Jun. 2015.
Kang, Chang-Mo , et al., "Fabrication of a vertically-stacked passive-matrix micro-LED array structure for a dual color display", Optics Express, vol. 25, No. 3; Feb. 6, 2017: pp. 2489-2495.
Kim, Hyo-Min , et al., "High Brightness Active Matrix Micro-LEDs with LTPS TFT Backplane", Society for Information Display 2018 Digest, pp. 880-883; 2018.
Lee, V.W. , et al., "A directly addressed monolithic LED array as a projection source", Journal of the Society for Information Display, 18(10), pp. 808-812; 2010.
Liu, Zhaojun , et al., "Decoding Micro-LED's Current Driving Methods", LEDinside of TrendForce Corp; Oct. 18, 2016.
Meitl, Matthew , et al., "Passive Matrix Displays with Transfer-Printed Microscale Inorganic LEDs", Society for Information Display 2016 Digest, pp. 743-746; 2016.
Peng, Deng , et al., "Full-Color Pixelated-Addressable Light Emitting Diode on Transparent Substrate (LEDoTS) Micro-Displays by CoB", IEEE, Journal of Display Technology, pp. 742-746; 2016.
Ploch, Neysha Lobo, "Chip designs for high efficiency III-nitride based ultraviolet light emitting diodes with enhanced light extraction", Doctoral Thesis; Technische Universität Berlin, Fakultät II—Mathematik und Naturwissenschaften; 2015.
Radauscher, Erich J., et al., "Miniaturized LEDs for Flat-Panel Displays", Proc. SPIE 10124, Light-Emitting Diodes: Materials, Devices, and Applications for Solid State Lighting XXI, 1012418; Feb. 16, 2017.
Sakakibara, Naoki , et al., "Independent drive of integrated multicolor (RGBY) micro-LED array using regularly arrayed InGaN based nanocolumns", 22nd Microoptics Conference (MOC2017), Tokyo, Japan, Nov. 19-22, 2017; The Japan Society of Applied Physics.
Shin, Yu-Chou , et al., "Chapter 17: LED Die Bonding", Materials for Advanced Packaging, Springer International Publishing; Switzerland 2017.
Smith, Euan C., "Total matrix addressing", Journal of the Society for Information Display 16(2), pp. 201-209; 2008.
Stauth, Sean A., et al., "Self-assembled single-crystal silicon circuits on plastic", Proceedings of the National Academy of Sciences, vol. 103, No. 38, pp. 13922-13927; Sep. 19, 2006.
Sun, Liusheng , et al., "A Micro-LED Driver with Bandwidth Expansion for Visible Light Communications", ECE Department, the Hong Kong University of Science and Technology, Hong Kong, 2017.
Yeo, Kiat Seng, et al., "Micro-LED arrays for display and communication: device structure and driver architecture", Singapore University of Technology and Design, Singapore; IEEE, 2017.
Zhang, Ke , et al., "Fully integrated active matrix programmable UV and blue micro-led display system on panel (SOP)", Journal of the Society for Information Display, 25(4), pp. 240-248; 2017.

* cited by examiner

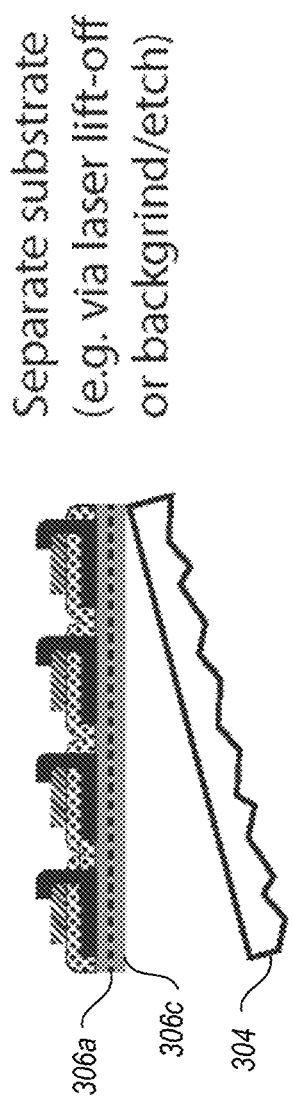
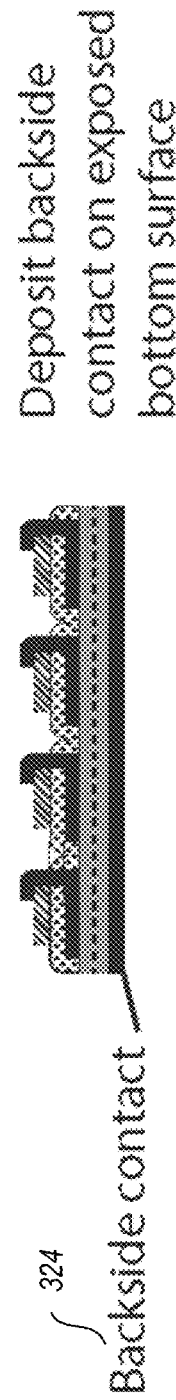
Fig. 3G — Separate substrate (e.g. via laser lift-off or backgrind/etch)
Fig. 3H — Deposit backside contact on exposed bottom surface

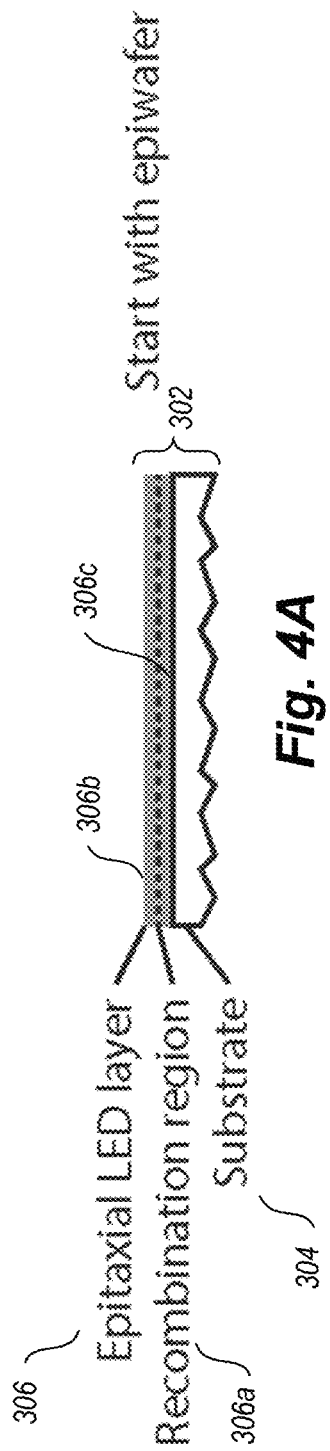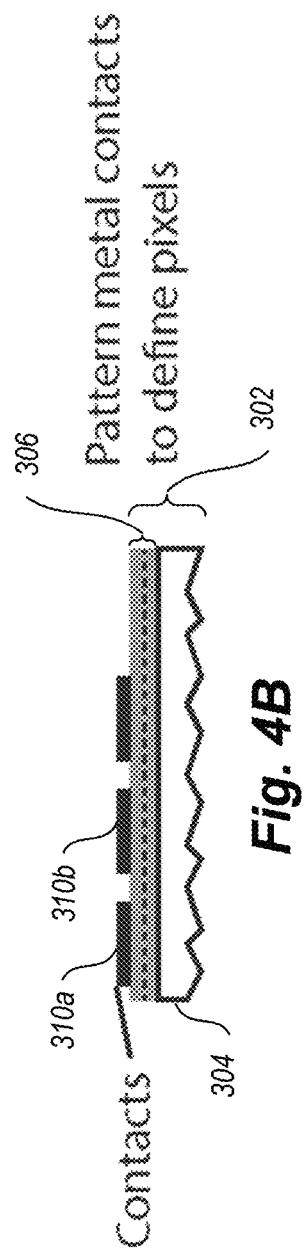
Fig. 4A
Fig. 4B

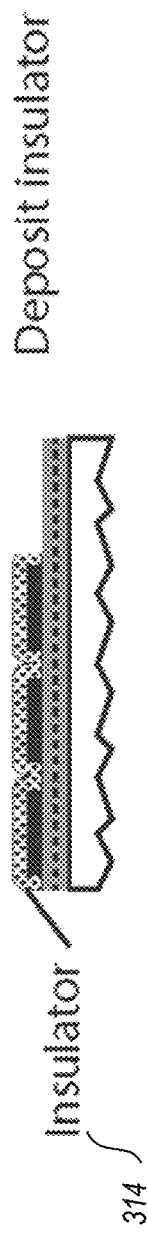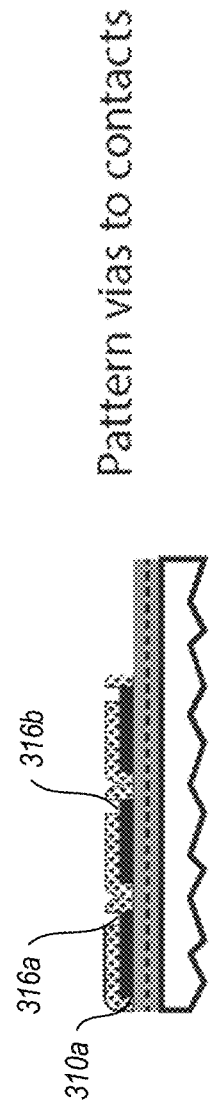

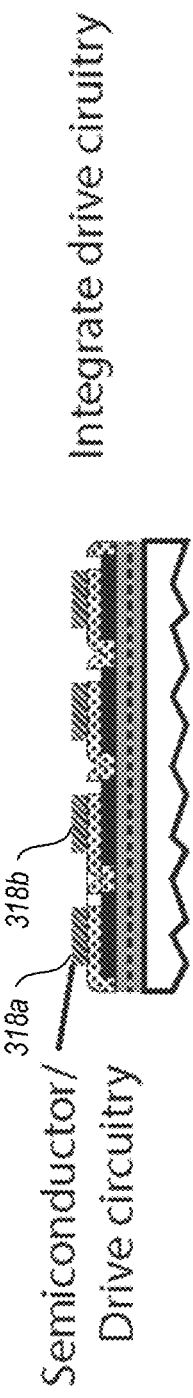
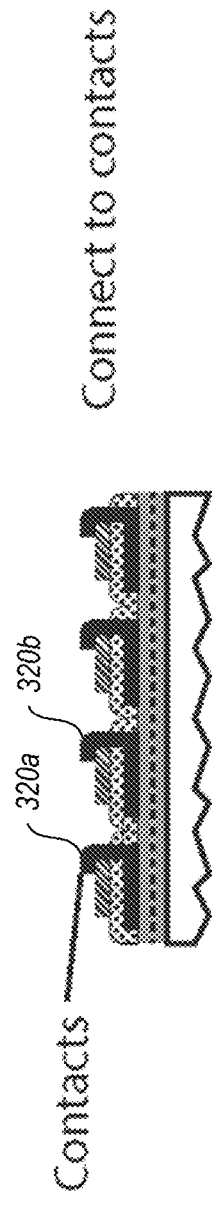
Fig. 5E
Fig. 5F

Separate substrate (e.g. via laser lift-off or backgrind/etch)

Integrate light extraction feature on exposed backside (e.g. scattering centers, photonic crystals, etc.)

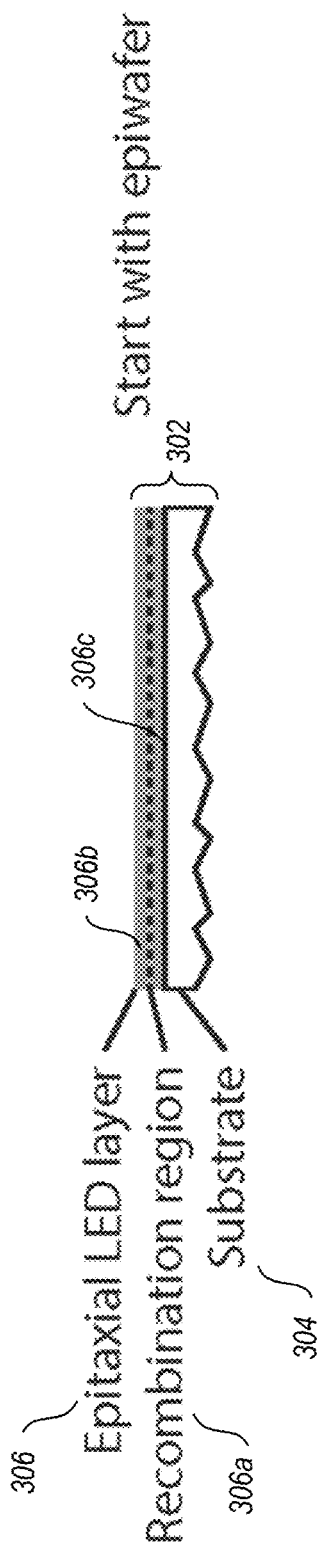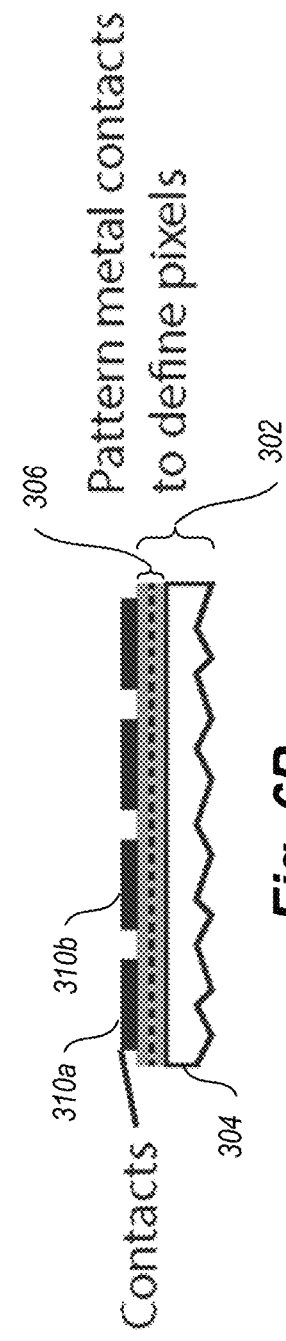
Fig. 6A
Fig. 6B

Pattern vias to contacts

Integrate drive circuitry

LED DISPLAY STRUCTURES AND FABRICATION OF SAME

TECHNICAL FIELD

This description generally relates to light emitting semiconductor devices and fabrication processes for fabricating a light emitting semiconductor device with a higher electroluminescence efficiency at smaller pixel sizes as compared to conventional approaches.

DESCRIPTION OF THE RELATED ART

Conventional light emitting diode (LED) and micro-LED technology suffers from a reduction in efficiency as the individual pixel elements are reduced in size. While the exact cause of the reduction in efficiency is not completely understood, it is believed that surface damage associated with deep etching processes used in the fabrication of micro-LED devices is one of the root causes of the reduction in efficiency.

There are three primary motivations currently driving the use of deep etching in micro-LED fabrication processes: i) the need for electrical isolation; ii) the need for high conductivity current spreading layers; and iii) the desire for superior light extraction from the LED semiconductor materials, which have a high index of refraction and tend to capture a significant fraction of the light generated from within the LED.

In one conventional approach, the LEDs in a matrix or array are isolated along one axis by etching a conducting top doped layer to isolate charge conduction along one axis. For example, see Kang, C. M., Kong, D. J., Shim, J. P., Kim, S., Choi, S. B., Lee, J. Y., Min, J. H., Seo, D. J., Choi, S. Y. and Lee, D. S., 2017. FABRICATION OF A VERTICALLY-STACKED PASSIVE-MATRIX MICRO-LED ARRAY STRUCTURE FOR A DUAL COLOR DISPLAY, *Optics Express*, 25(3), pp. 2489-2495.

One approach to eliminating this need for isolation is to directly address the LEDs with individual driving circuits at the perimeter. However, this strategy is not scalable to large pixel counts, as it requires separate conductors for each LED in the matrix. For example see Lee, V. W. and Kymissis, I., A DIRECTLY ADDRESSED MONOLITHIC LED ARRAY AS A PROJECTION SOURCE. *Journal of the Society for Information Display*, 18(10), pp. 808-812 (2010).

The use of an active matrix addressing approach eliminates this scaling obstacle and allows for the elimination of such an isolation. Several systems have been demonstrated using such an active matrix approach.

Another proposed approach is the use of metal solder balls or indium bumps to connect isolated LEDs to a CMOS integrated circuit containing individual drive circuits for each LED. While this approach allows for significant device scaling, hybrid bonding approaches can benefit from the isolation provided by the etching of semiconductor pillars and the creation of isolated islands to overcome possible parasitic connections associated with the metal deformation in the hybrid bonding process. The use of a monolithically integrated, photolithographically patterned electrode structure can eliminate this risk at a higher resolution and for smaller pixel sizes than possible using the etched pillar approach.

A third motivation for the etching of the top layer is to form a high conductivity layer to spread the current on the bottom doped semiconductor film (e.g. the n-GaN layer in a traditional LED stack. See Zhang, K., Peng, D., Lau, K. M. and Liu, Z., FULLY INTEGRATED ACTIVE MATRIX PROGRAMMABLE UV AND BLUE MICRO-LED DISPLAY SYSTEM ON PANEL (SOP), *Journal of the Society for Information Display*, 25(4), pp. 240-248 (2017). This work shows the use of pillars for both electrical isolation and to expose the n-GaN layer for the formation of a high conductivity current distribution layer. The doped semiconductor layers used in electroluminescent devices are generally of relatively high resistance, and result in a significant loss of voltage under device. This problem can be mitigated by adding a high conductivity layer to spread the current on such a layer. The need for etching to introduce such a current distribution layer can be eliminated by first separating the LED from the substrate and adding the ground plane on the bottom layer of the semiconductor (e.g. the n-GaN layer in Figure XX). Such an approach allows for the LED structure envisioned by the invention without the problems associated with etching the LEDs in the vicinity of the recombination region of the electroluminescent device.

The index of refraction of semiconductors used in LED devices is typically relatively high, for example GaN has an index of refraction of 2.4. Such leads to a relatively small escape cone for light generated within the semiconductor. This issue can be overcome using a number of techniques that allow for light escape from the semiconductor layers through lensing or faceting provided by LED etching processes. Several strategies have been proposed in the art for overcoming this approach using etching techniques. For example, see U.S. Pat. No. 9,812,494B2 to Percival, et al., which employs etched facets in an LED architecture for the improvement of light extraction from the device.

BRIEF SUMMARY

LED structures (e.g., LED arrays) and fabrication methods can reduce or even eliminate deep etching, and associated defect formation, proximate sites of individual LEDs. Such approaches can achieve desired electrical isolation without deep etching, provide a high conductivity current spreading layer, and, or reduce losses otherwise associated with conventional fabrication approaches. Some implementations advantageously lift off or separate an insulating substrate from a wafer to expose a bottom surface of the epitaxial LED layer and forms a backside contact (e.g., ground plane) overlying the bottom surface. Other implementations isolate deep etching away from sensitive regions and locate the backside contact on a top surface of the epitaxial LED layer. Some implementations form light extraction features (e.g., photonic crystals) on the exposed bottom surface. The top surface of the epitaxial LED layer may be undoped to improve electrical isolation. The bottom surface of may be shallow etched to improve light extraction.

The approaches proposed herein address one or more of the issues described above associated with conventional approaches, allowing for the fabrication of LEDs without sidewall damage in the regions of relevance for efficient electroluminescence and permitting high efficiency to be demonstrated in LEDs of small dimensions.

Because of the limitations of conventional approaches (e.g., need for matrix isolation, need for a current spreading layer on a bottom doped layer, and isolation limitations of metal/metal bonding), the use of a process in which the top layer is unpatterned or minimally patterned has not appear to have been previously recognized to date in the state of the art. The approaches proposed herein address or even eliminate these limitations by integrating an active matrix distribution architecture, using lithographic processing of the contact elements, and in at least some implementations, placing the current spreading layer on an underside of the device after separation of the LED.

The approaches described herein can result in an architecture in which light can be extracted from an unpatterned or minimally patterned structure. By releasing the LED before structuring the backside, it is possible to incorporate light extraction elements closer to a waveguiding volume of the LED without the need for etching into the structure. The use of scattering elements or photonic crystals on the surfaces proximal to the LED formed without etching into the semiconducting layers can also allow for stronger coupling of light from the guided modes in the semiconductor to free-space modes, improving light extraction and eliminating the need to etch into the sensitive regions of the LED stack.

A method of fabricating a light emitting diode structure may be summarized as including: forming a set of contacts overlying a front surface of an epitaxial LED layer of a wafer, the wafer including a substrate and the epitaxial LED layer carried by the substrate; forming an insulator overlying the set of contacts; forming a plurality of throughholes that extend through the insulator to the contacts; integrating a set of drive circuits; connecting respective ones of the drive circuits to respective ones of the contacts by way of respective ones of a set of vias formed by the throughholes; separating a structure resulting from the previous operations from the substrate to expose a back surface of the epitaxial LED layer; and forming at least one backside contact overlying the back surface of the epitaxial LED layer exposed by the separation of the substrate therefrom.

Forming a set of contacts may include depositing a metal layer and patterning the metal layer. Forming a set of contacts overlying a front surface of an epitaxial LED layer of a wafer, the wafer including a substrate and the epitaxial LED layer carried by the substrate may include forming the set of contacts directly on the front surface of the epitaxial LED layer. Forming an insulator overlying the set of contacts may include depositing an insulative material to cover the set of contacts and to cover a portion of the front surface of the epitaxial LED layer that is exposed with respect to the contacts. Separating a structure resulting from the previous operations from the substrate may include performing a laser lift-off of the resulting structure from the substrate. Separating a structure resulting from the previous operations from the substrate may include back-grinding the substrate from the resulting structure. Separating a structure resulting from the previous operations from the substrate may include etching the substrate from the resulting structure. Forming at least one backside contact overlying the back surface of the epitaxial LED layer exposed by the separation of the substrate therefrom may include forming a ground plane that overlies at least a majority of the back surface of the epitaxial LED layer exposed by the separation of the substrate therefrom. Once the drive circuits have been integrated, the fabrication may advantageously omit or avoid performing any deep etching operations on the front surface of the epitaxial LED layer and may omit or avoid performing any deep etching operations on any structures carried by the front surface of the epitaxial LED layer. Forming at least one backside contact overlying the back surface of the epitaxial LED layer exposed by the separation of the substrate therefrom may include forming a ground plane the covers at least a majority of the back surface of the epitaxial LED layer exposed by the separation of the substrate therefrom. The method may further include: before forming at least one backside contact overlying the back surface of the epitaxial LED layer exposed by the separation of the substrate therefrom, integrating one or more light extraction features on the back surface of the epitaxial LED layer exposed by the separation of the substrate therefrom. Integrating one or more light extraction features on the back surface of the epitaxial LED layer exposed by the separation of the substrate therefrom may include forming photonic crystal. Forming at least one backside contact overlying the back surface of the epitaxial LED layer exposed by the separation of the substrate therefrom may include forming the at least one backside contact overlying the one or more light extraction features on the back surface of the epitaxial LED layer exposed by the separation of the substrate therefrom. The method may further include: between forming the set of contacts and forming the insulator, performing a shallow etch into portions of the front surface of the epitaxial LED layer to improve light extraction. The method may further include: between forming the set of contacts and forming the insulator, undoping at least a portion of the front surface of the epitaxial LED layer to at least a nominal depth to improve isolation of the contacts. Forming an insulator overlying the set of contacts may include depositing the insulator over the contacts and the undoped portions of the front surface of the epitaxial LED layer. Undoping at least a portion of the front surface of the epitaxial LED layer to at least a nominal depth may include exposing at least the portion of the front surface of the epitaxial LED layer to de-doping reagent.

A light emitting diode (LED) structure may be summarized as including: an epitaxial light emitting diode (LED) layer of a wafer; a set of contacts overlying a front surface of the epitaxial light emitting diode (LED) layer; an insulator overlying the set of contacts; a plurality of throughholes that extend through the insulator to respective ones of the contacts; a set of drive circuits; a set of electrically conductive paths that connect respective ones of the drive circuits to respective ones of the contacts by way of respective ones of a set of vias formed by the throughholes; and at least one backside contact overlying a back surface of the epitaxial LED layer.

The wafer may omit a substrate to expose the back surface of the epitaxial LED layer. The at least one backside contact may be a ground plane that overlies at least a majority of the back surface of the epitaxial LED layer. At least the front surface of the epitaxial LED layer may be devoid of imperfections that would otherwise result from deep etching. The LED structure may further include: one or more light extraction features carried by the back surface of the epitaxial LED layer. The LED structure may further include: one or more light photonic crystals carried by the back surface of the epitaxial LED layer. The LED structure may further include: a number of shallow trenches etched into to portions of the front surface of the epitaxial LED layer to improve light extraction. The LED structure may further include: a number of undoped portions in the front surface of the epitaxial LED layer, the undoped portions undoped to at least a nominal depth to improve isolation of the contacts.

A method of fabricating a light emitting diode structure may be summarized as including: forming a set of contacts overlying a front surface of an epitaxial LED layer of a wafer, the wafer including a substrate and the epitaxial LED layer carried by the substrate; forming an insulator overlying the set of contacts; forming a plurality of throughholes that extend through the insulator to the contacts; integrating a set of drive circuits; connecting respective ones of the drive circuits to respective ones of the contacts by way of respective ones of a set of vias formed by the throughholes; removing a portion of the front surface of the epitaxial LED layer that is spaced laterally from any of the contacts; and forming at least one backside contact overlying the front surface of the epitaxial LED layer at that one or more sites of the removed portions of the front surface of the epitaxial LED layer.

Forming a set of contacts may include depositing a metal layer and patterning the metal layer. Forming a set of contacts overlying a front surface of an epitaxial LED layer of a wafer, the wafer including a substrate and the epitaxial LED layer carried by the substrate may include forming the set of contacts directly on the front surface of the epitaxial LED layer. Forming an insulator overlying the set of contacts may include depositing an insulative material to cover the set of contacts and to cover a portion of the front surface of the epitaxial LED layer that is exposed with respect to the contacts. Forming at least one backside contact overlying the front surface of the epitaxial LED layer at that one or more sites of the removed portions of the front surface of the epitaxial LED layer may include forming a ground plane that overlies at a portion of the front surface of the epitaxial LED layer exposed by the removal of the portion thereof.

A light emitting diode (LED) structure may be summarized as including: an epitaxial light emitting diode (LED) layer of a wafer; a set of contacts overlying a front surface of the epitaxial light emitting diode (LED) layer; an insulator overlying the set of contacts; a plurality of throughholes that extend through the insulator to respective ones of the contacts; a set of drive circuits; a set of electrically conductive paths that connect respective ones of the drive circuits to respective ones of the contacts by way of respective ones of a set of vias formed by the throughholes; and at least one backside contact overlying a portion the front surface of the epitaxial LED layer and extending along two or more contacts.

The wafer may omit a substrate to expose the back surface of the epitaxial LED layer. The at least one backside contact may be a ground plane that overlies at least a majority of the back surface of the epitaxial LED layer. At least the front surface of the epitaxial LED layer may be devoid of imperfections that would otherwise result from deep etching.

A method of fabricating a light emitting diode structure may be summarized as including: forming a set of contacts overlying a front surface of an epitaxial LED layer of a wafer, the wafer including a conductive substrate and the epitaxial LED layer carried by the substrate; forming an insulator overlying the set of contacts; forming a plurality of throughholes that extend through the insulator to the contacts; integrating a set of drive circuits; connecting respective ones of the drive circuits to respective ones of the contacts by way of respective ones of a set of vias formed by the throughholes; and connecting the conductive substrate to respective ones of a plurality of LEDs defined in the epitaxial LED layer.

Forming a set of contacts may include depositing a metal layer and patterning the metal layer. Forming a set of contacts overlying a front surface of an epitaxial LED layer of a wafer, the wafer including a substrate and the epitaxial LED layer carried by the substrate may include forming the set of contacts directly on the front surface of the epitaxial LED layer. Forming an insulator overlying the set of contacts may include depositing an insulative material to cover the set of contacts and to cover a portion of the front surface of the epitaxial LED layer that is exposed with respect to the contacts.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIGS. 3A-3H are cross-sectional views illustrating sequential operations of a first fabrication process to produce an LED structure, according to at least one illustrated implementation.

FIGS. 4A-4H are cross-sectional views illustrating sequential operations of a second fabrication process to produce an LED structure, according to at least one illustrated implementation, which adds a spatially isolated deep etch operation in lieu of a substrate separation operation to those of the first fabrication process.

FIGS. 5A-5I are cross-sectional views illustrating sequential operations of a third fabrication process to produce an LED structure, according to at least one illustrated implementation which adds a light extraction features formation operation to those of the first fabrication process to improve light extraction.

FIGS. 6A-6I are cross-sectional views illustrating sequential operations of a fourth fabrication process to produce an LED structure, according to at least one illustrated implementation which adds a shallow etching operation to those of the first fabrication process to improve light extraction.

DETAILED DESCRIPTION

Figure 1A:
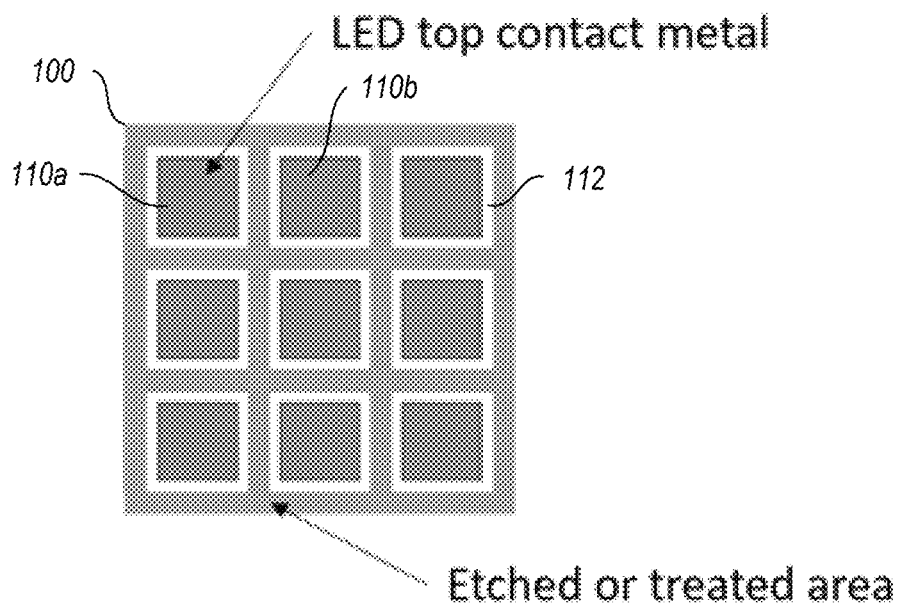
FIG. 1A is a top plan view of a light emitting diode (LED) structure in the form of an integrated circuit comprising an array of LEDs or LED pixels, according to at least one illustrated implementation.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, certain structures associated with light emitting diodes (LEDs), drive circuits, integrated circuits and fabrication equipment have not been shown or described in detail to avoid unnecessarily obscuring descriptions of the various implementations and embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one implementation" or "an implementation" or "one embodiment" or "an embodiment" means that a particular feature, structure or characteristic described in connection with the embodiment is included in at least one implementation or at least one embodiment. Thus, the appearances of the phrases "one implementation" or "an implementation" or "in one embodiment" or "in an embodiment" in various places throughout this specification are not necessarily all referring to the same implementation or the same embodiment. Furthermore, the particular features, structures, or characteristics may be combined in any suitable manner in one or more implementations or in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the implementations or embodiments.

Described herein are fabrication processes or methods, and structures or configurations in which an addressing architecture permits the use of unpatterned or minimally patterned semiconductor materials. By reducing or even eliminating the need to etch or deeply etch the semiconductor material in the region of light emission to create isolation and extraction features, the damage created by the isolation etch is reduced or even eliminated, and the LED performance is significantly improved, even at smaller device sizes.

There are several concepts described herein that allow for, and take advantage of, the reduction of or entire elimination of elimination of etching in a micro-LED system.

In implementations in which an active matrix addressing system is employed, electrical current can be supplied fully selected from a top surface of the LED structure. This architecture allows for addressing without the need for etching typically used to achieve row/column isolation in the LED structure.

In some implementations in which the LED structure is not required to be patterned, alternative light extraction features such as photonic crystals or scattering elements can be added on a planar surface (e.g., front surface, top surface) of the LED, advantageously avoiding the need for etching to form faceting, roughness, or other features for light extraction. For example, the LED structure can be released from the substrate using laser processing, etching, ion slicing, or other techniques. This allows for proximal access to the light generating region and the site where wave-guiding generally occurs in LEDs. This approach advantageously allows integration of light extraction features without etching, for example integration of the light extraction features on or into a recombination region of an LED epitaxial substrate.

A third benefit of etching is the use of the etch to expose the bottom semiconductor layer. Separation of the LED from the growth substrate allows for a current spreading layer (e.g., ground plane) to be deposited on a backside or back face of the remaining structure after separation. This can also eliminate an etching operation. Alternatively, an initial wafer may comprise a conductive substrate for the LED growth (e.g., doped silicon), which could serve as the current spreading layer (e.g., ground plane) on the back face, without separation of the substrate from the wafer.

Alternatively or additionally, an LED structure may be formed with a minimally etched front or top surface, for example in which only a shallow trench in a front surface or top layer is etched without etching into a recombination region of an LED epitaxial layer. Such can, for example, include etching only into the p-GaN layer in a p-GaN top device. Such can, for example, include etching only into the n-GaN layer in an n-GaN top device. Such can, for example, include etching only into the n-GaN layer in a p-GaN top device which was released from a substrate. Such can, for example, include etching only into the p-GaN layer in an n-GaN top device which was released from a substrate. Such an approach can, for example, additionally or alternatively be employed to integrate or add light extraction features (e.g., photonic crystals, mirrors, shallow facets) without etching into the recombination region of the LED epitaxial layer. Such can, for example include integration or addition of light extraction features after release of the LED epitaxial layer from a substrate (e.g., insulative substrate) that carries the LED epitaxial layer or without release of the LED epitaxial layer from a substrate.

Additionally or alternatively, the above approaches may employ alternative techniques such as de-doping or the formation of oxide, chloride, or other non-conductive layers on an LED epitaxial layer to provide or to enhance electrical isolation of components (e.g., individual LEDs).

An additional benefit of etching, ion implantation, or shallow surface restructuring on either the front/top or back/bottom side of the semiconductor (e.g., after release of the semiconductor layer from the substrate) is that the resulting structured surface layer can improve optical extraction, e.g., through the increase in roughness, without damaging the light emitting layers, thus conferring the benefit associated with an unetched or minimally etched structure to small pixel size LEDs.

Figure 1B:
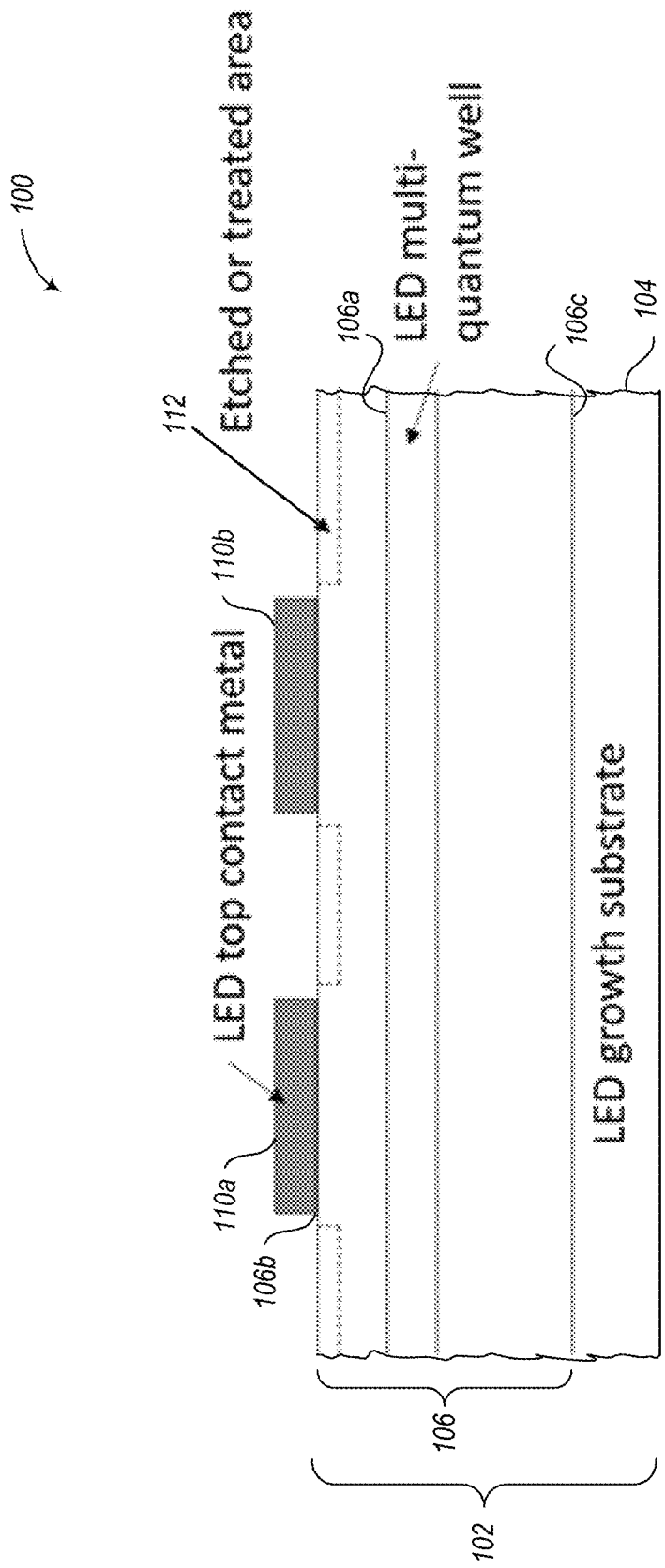
FIG. 1B is a side elevation view of a portion of the light emitting diode (LED) structure of FIG. 1A, better illustrating shallow trenched or de-doped areas of an epitaxial LED layer, according to at least one illustrated implementation.

FIGS. 1A and 1B show a light emitting diode (LED) structure 100 in the form of an integrated circuit comprising a set of LEDs or LED pixels 102a-102n (six shown, only to called out for drawing clarity, collectively 102), according to at least one illustrated implementation. While illustrated the set of LEDs or LED pixels 102a-102n are illustrated as an ordered array of columns and rows, the LEDs or LED pixels may be dispersed in other layouts or arrangements, which may be ordered, unordered, or even random.

The LED structure 100 includes a wafer 102, that at least initially includes a substrate 104 which carries an LED layer (e.g., LED epitaxial layer 106), identified in FIG. 1B which may itself includes a recombination region 106a or an LED multi-quantum well. As explained elsewhere herein, the substrate 104 may be removed or separated and a current distribution layer (e.g., ground plane) can be added or formed in its place. Alternatively, in some implementations the substrate 104 is electrically conductive (e.g., doped silicon), and can thus form the current distribution layer (e.g., ground plane). The LED structure 100 includes set of contacts 110a,110b (six shown in FIG. 1A, two shown in FIG. 1B, only two called out for drawing clarity, collectively 110) at a front or upper surface 106b of the LED epitaxial layer 106, typically one contact per LEDs or LED pixel 102a-102n. The contacts 110 are used to supply gating signals to the respective LEDs or LED pixels, for example as part of an active matrix addressing structure and associated operation.

As best illustrated in FIG. 1B, the LED structure 100 includes a number of areas 112 (only one called out) that are either etched, treated or both etched and treated. Such may advantageously improve light extraction and, or, produce or enhance electrical isolation. In particular, the LED structure 100 may include a number of shallow etched or treated trenches 112. A shallow etched or treated trenches 112 may extend into only a front or upper portion 106b of the LED epitaxial layer 106, for example not extending into a recombination region 106a of the LED epitaxial layer 106. Additionally or alternative, the LED structure 100 may treated to render select regions electrically non-conductive as discussed elsewhere herein, for example by de-doping and, or, by formation of oxides, chlorides other electrically non-conductive layers or regions.

Figure 2:
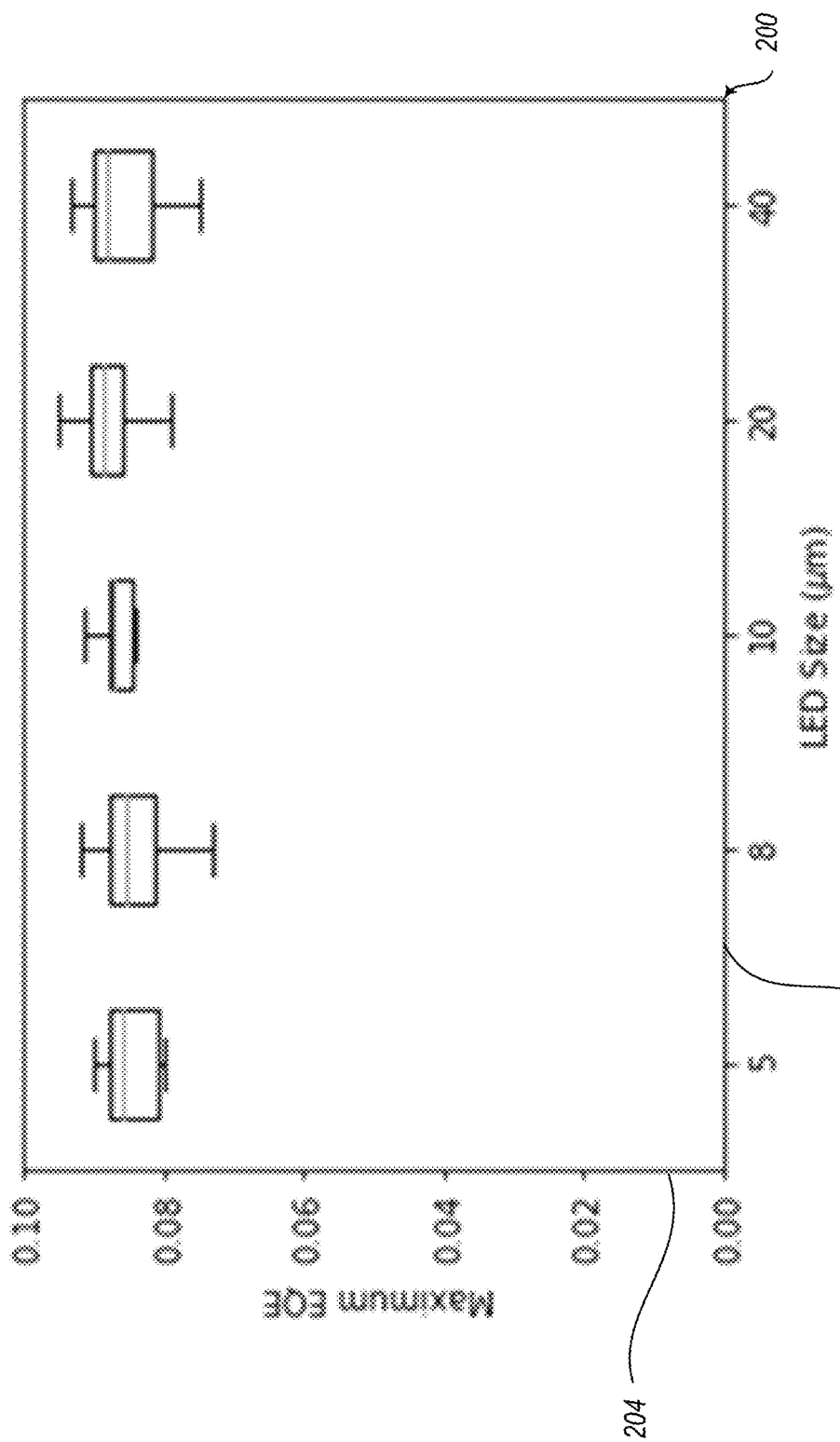
FIG. 2 is an exemplary graph showing external quantum efficiency (EQE) versus LED size for structures fabricated as described herein, according to at least one illustrated implementation.

FIG. 2 shows an exemplary graph 200 of external quantum efficiency (EQE) versus LED size for LED structures fabricated as described herein, according to at least one illustrated implementation.

The external quantum efficiency (EQE) is illustrated along an E-axis 202 and the LED size is illustrated along the Y-axis 204. The graph 200 illustrates that by reducing or even eliminating the need to etch or deeply etch the semiconductor material in the region of light emission to create isolation and extraction features, the damage created by the isolation etch is reduced or even eliminated, and the LED performance is consequently significantly improved, even at smaller sizes.

FIGS. 3A-3H illustrate a set of sequential operations of a first fabrication process to produce an LED structure 300a, according to at least one illustrated implementation.

Figure 3A:
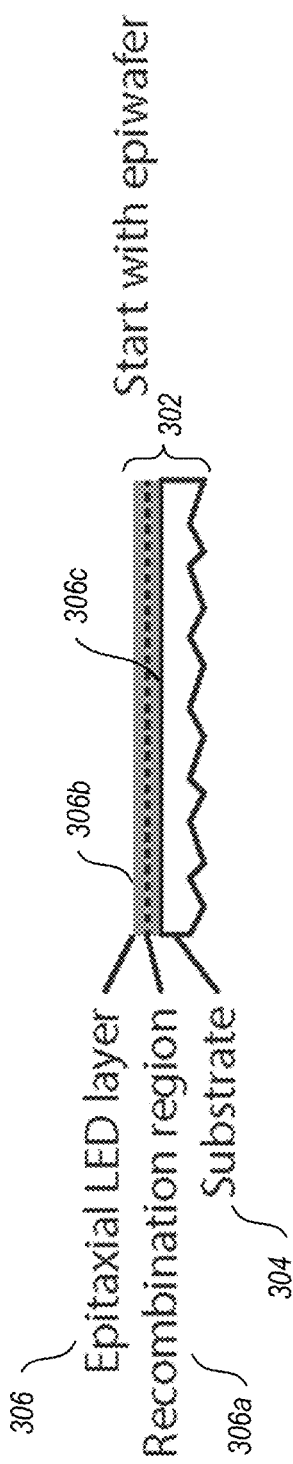

With reference to FIG. 3A, the first fabrication process can start with a wafer 302, that includes a substrate 304 that carries (e.g., directly or indirectly) an epitaxial LED layer 306 that itself includes a recombination region 306a. The substrate 304 may be an electrically non-conductive substrate, for example an non-doped silicon substrate, a sapphire substrate, a substrate with an oxide layer. The epitaxial LED layer 306 may include a front or upper surface 306b and a back or lower surface 306c, with the recombination region 306a therebetween. The front or upper surface 306b and the back or lower surface 306c are major surfaces of the epitaxial LED layer 106, typically having areas substantially large than the areas of other surfaces (e.g., sidewalls) of the epitaxial LED layer 106.

Figure 3B:
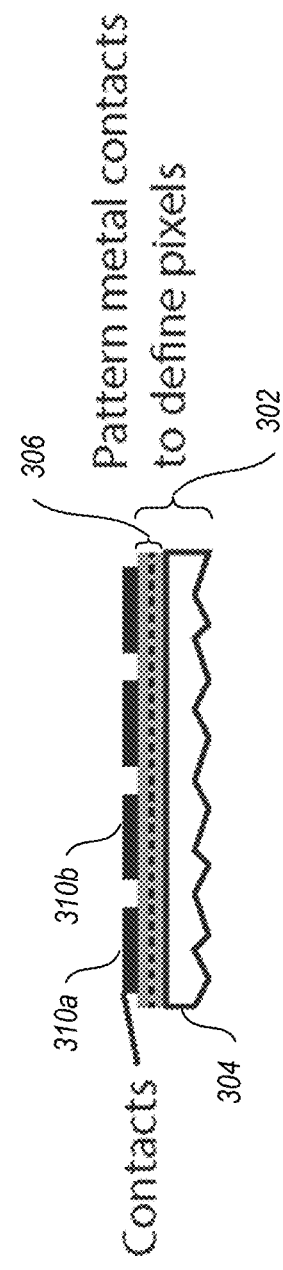

With reference to FIG. 3B, a set of contacts 310a, 310b (only two called out, collectively 310) are formed overlying respective portions the front or upper surface 306b of the epitaxial LED layer 306. For example, a metal layer may be deposited directly or indirectly on the front or upper surface 306b of the epitaxial LED layer 306, and then the metal layer patterned for instance via an etching operation that does little to no damage to the epitaxial LED layer 306. Various metals or other electrical conductors suitable for use in integrated circuit fabrication can be employed.

Figure 3C:
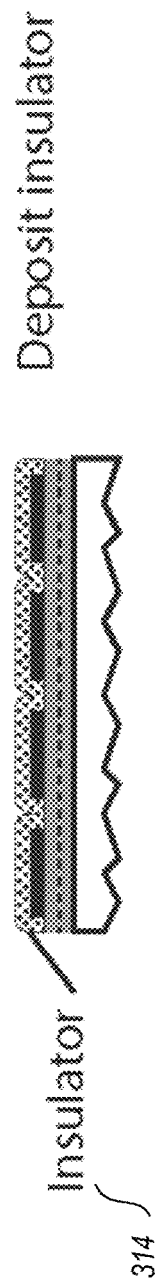

With reference to FIG. 3C, an electrical insulator 314 is deposited or grown overlying the set of contacts 310 and any portions of the front or upper surface 306b of the epitaxial LED layer 306. For example, the electrical insulator layer 314 may be deposited directly or indirectly on the front or upper surface 306b of the epitaxial LED layer 306. Various electrical insulators or electrically insulative material (e.g., oxides) suitable for use in integrated circuit fabrication can be employed.

Figure 3D:
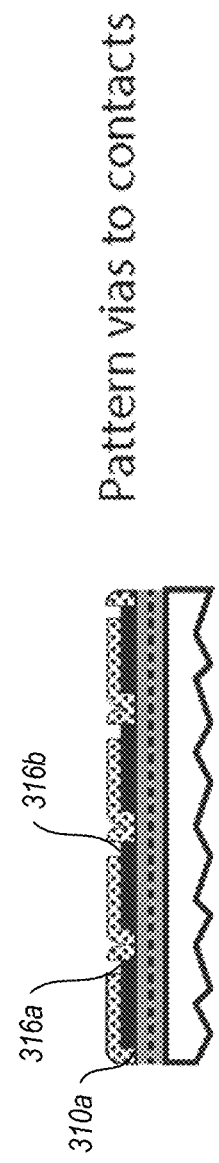

With reference to FIG. 3D, a set of throughholes 316a, 316b (only two called out, collectively 316) for vias are formed through the electrical insulator 314, to provide electrical coupling to the contacts 310 that underlie the electrical insulator 314. The throughholes 316 may be formed via a shallow etching of the electrical insulator 314.

Figure 3E:
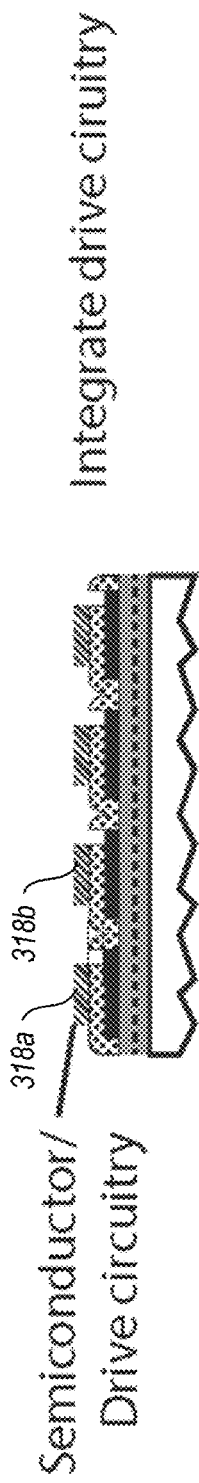

With reference to FIG. 3E, drive circuitry comprising a set of drive circuits 318a, 318b (only two called out, collectively 318) are integrated with intermediate structure. For example, a respective drive circuits 318a, 318b may be placed or formed on the electrical insulator 314. The drive circuits 318a, 318b may, for example, be aligned with or in registration with respective ones of the contacts 310.

Figure 3F:
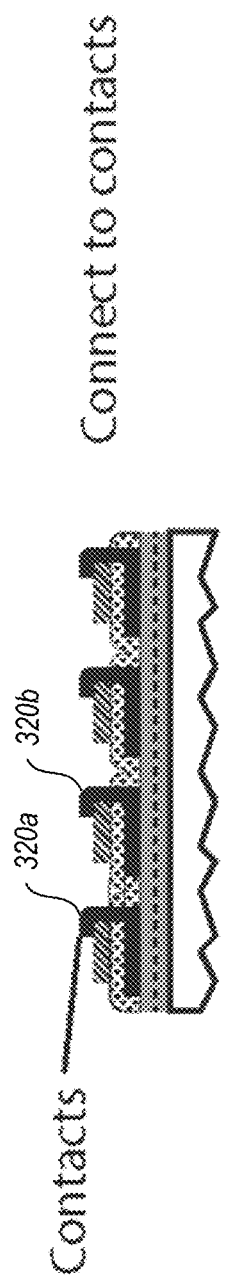

With reference to FIG. 3F, the drive circuits 318a, 318b are electrically coupled to respective ones of the contacts 310. For example, an electrically conductive material (e.g., metal) 320a, 320b (two called out, collectively 320) may be deposited to fill the previously formed throughholes 316, and provide a set of electrically conductive connections between respective pairs of the contacts 310 and the drive circuits 318. The throughholes 316 and portion of the electrical connection 320 extending therethrough form a set of vias. Various metals or other electrical conductors suitable for use in integrated circuit fabrication can be employed.

With reference to FIG. 3G, a structure 322 resulting from the previous operations is separated from the substrate 304 to expose the back or bottom surface 306c of the epitaxial LED layer 306. Separation can be realized via various techniques, for example, laser processing, etching, ion slicing and other integrated circuit fabrication techniques. Such also advantageously provides proximal access to the light generating region 306d of the epitaxial LED layer 306.

With reference to FIG. 3H, a backside contact 324 is formed overlying the back or lower surface 306c of the epitaxial LED layer 306 exposed by the separation of the substrate 304 therefrom. The backside contact 324 can take the form of a ground plane or ground planes or other electrode. For example, a metal layer may be deposited directly or indirectly on the back or lower surface 306c of the epitaxial LED layer 306. Various metals or other electrical conductors suitable for use in integrated circuit fabrication can be employed.

A set of LEDs 326 (only one called out) are thus formed, each LED including a contact 310, drive circuitry 318, connection therebetween 320, portion of the epitaxial LED layer 306, and backside contact 324. Such is a suitable structure for active matrix array addressing.

FIGS. 4A-4H illustrate a set of sequential operations of a second fabrication process to produce an LED structure 300b, according to at least one illustrated implementation, which adds a spatially isolated deep etch operation in lieu of a substrate separation operation to those of the first fabrication process.

Many of the operations and structures are similar, or even identical, to those described in reference to FIGS. 3A-3H. Identical reference numbers are used to identify those operations and structures which are similar or even identical to those of FIGS. 3A-3H. In the interest of conciseness, only significant differences between the implementation of FIGS. 3A-3H and the implementation of FIGS. 4A-4H are discussed below.

In contrast to the implementation illustrated in FIGS. 3A-3H, the implementation illustrated in FIGS. 4A-4H omits the separation of the substrate 304, and locates the backside contact 324 overlying the front or upper surface 306b of the epitaxial LED layer 306.

Figure 4E:
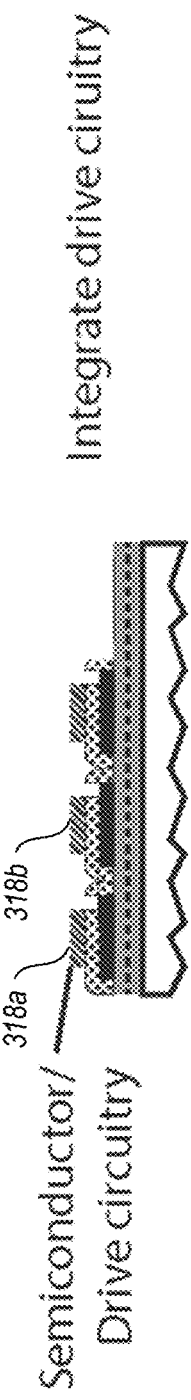
Figure 4F:
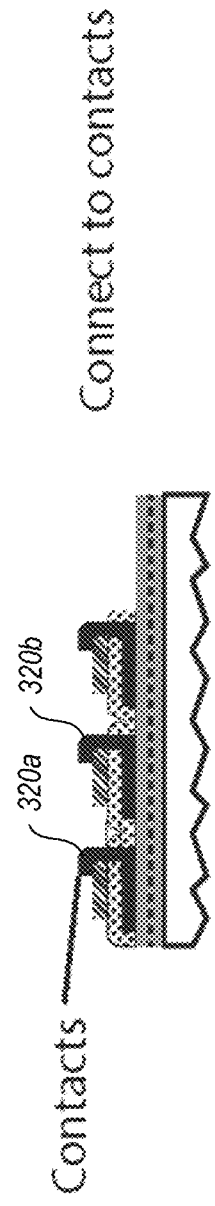
Figure 4G:
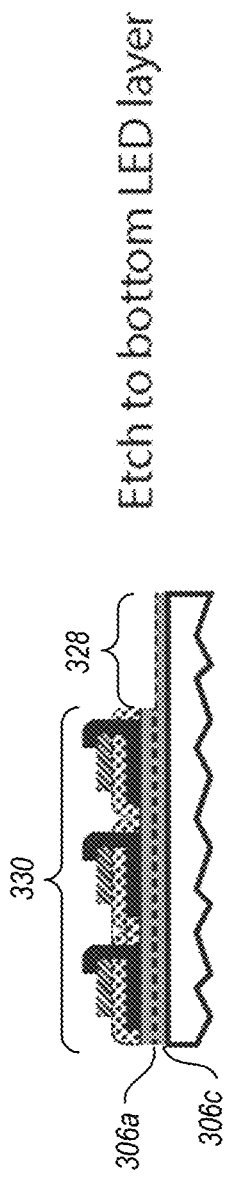

In particular, as illustrated in FIG. 4G, a portion 328 of the front or upper surface 306b of the epitaxial LED layer 306 is removed (e.g., etched). That portion 328 is spatially separated from regions 330 of the epitaxial LED layer 306 that will comprise the respective LEDs. The separation is sufficient to reduce or eliminate the introduction of defects in those regions 330 of the epitaxial LED layer 306. Further, the etching may be relatively shallow, thereby reducing or eliminating the introduction of defects in those regions 330 of the epitaxial LED layer 306 that will comprise the respective LEDs. For example, as illustrated in FIG. 4G, the etching stops short of the recombination region 306a of the epitaxial LED layer 306.

Figure 4H:
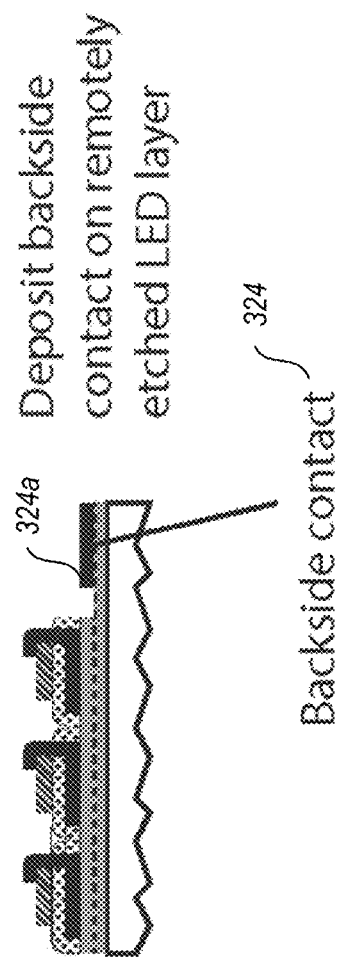

As illustrated in FIG. 4H, a backside contact 324a is formed overlying the front or upper surface 306b of the epitaxial LED layer 306 exposed by the etching. The backside contact 324a can take the form of a ground plane or ground planes or other electrode. For example, a metal layer may be deposited directly or indirectly on the front or upper surface 306b of the epitaxial LED layer 306. Various metals or other electrical conductors suitable for use in integrated circuit fabrication can be employed.

In a variation, the substrate 304 may be removed from the remaining structure, for example, to facilitate fabrication of light extraction features on the back or lower surface of the epitaxial layer, as discussed elsewhere herein.

FIGS. 5A-5I illustrate a set of sequential operations of a third fabrication process to produce an LED structure 300c, according to at least one illustrated implementation which adds a light extraction features formation operation to those of the first fabrication process to improve light extraction.

Many of the operations and structures are similar, or even identical, to those described in reference to FIGS. 3A-3H. Identical reference numbers are used to identify those operations and structures which are similar or even identical to those of FIGS. 3A-3H. In the interest of conciseness, only significant differences between the implementation of FIGS. 3A-3H and the implementation of FIGS. 5A-5I are discussed below.

Figure 5A:
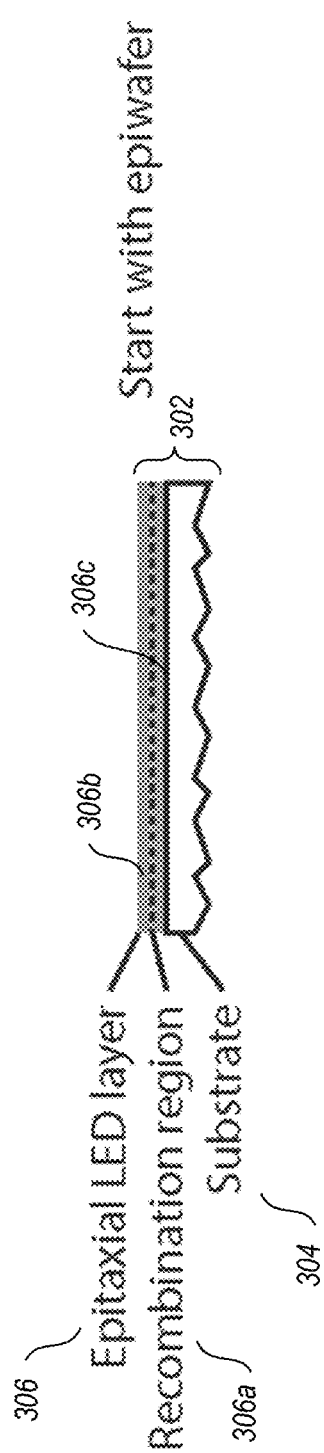
Figure 5B:
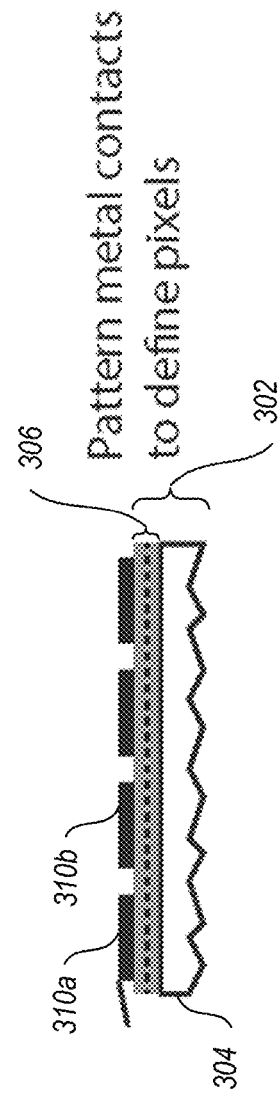
Figure 5C:
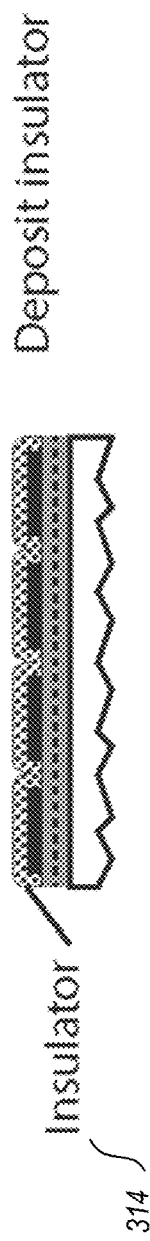
Figure 5D:
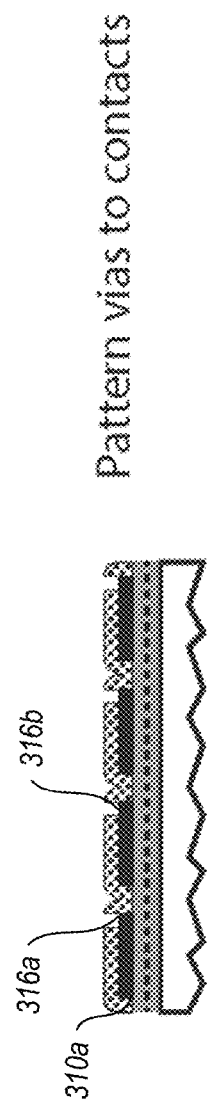
Figure 5G:
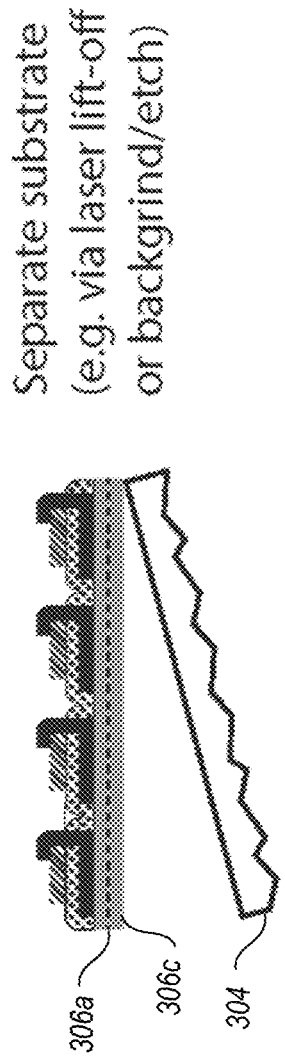
Figure 5H:
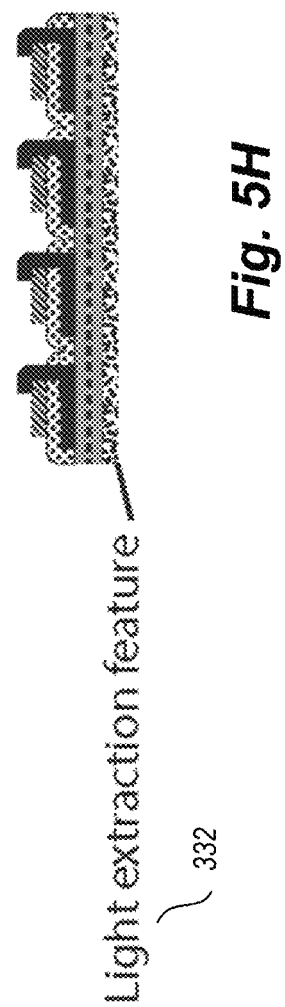
Figure 5I:
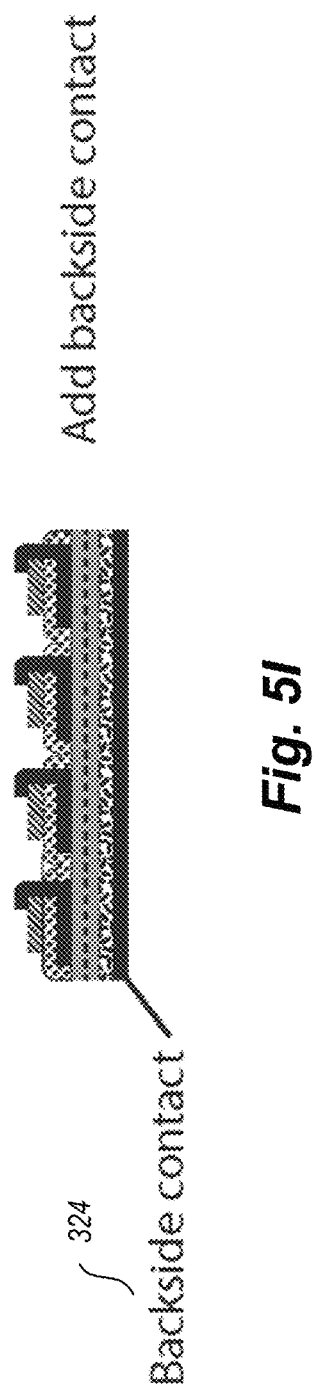

In contrast to the implementation illustrated in FIGS. 3A-3H, the implementation illustrated in FIGS. 5A-5I adds a light extraction feature formation operation, best illustrated in FIG. 5H. For example, after the separation of the substrate 304, one or more light extraction features 332 may be added to, or formed on, the exposed back or lower surface 306c of the epitaxial LED layer 306. The light extraction features 332 can take any one or more of a variety of forms, e.g., photonic crystals (shown), scattering elements, mirrors, shallow facets, deposited on or formed in the exposed back or lower surface 306c of the epitaxial LED layer 306. The use of photonic crystals 332 or scattering elements on the surfaces proximal to the LED formed without etching into the semiconducting layers can also allow for stronger coupling of light from the guided modes in the semiconductor to free-space modes, improving light extraction and eliminating the need to etch into the sensitive regions of the LED stack. This technique can be used with any one or more of the other implementations illustrated or described herein, other than perhaps those illustrated in FIGS. 4A-4H, in which the substrate 304 is not removed or separated from the remaining structure.

FIGS. 6A-6I illustrate a set of sequential operations of a fourth fabrication process to produce an LED structure 300d, according to at least one illustrated implementation which adds a shallow etching operation to those of the first fabrication process to improve light extraction.

Many of the operations and structures are similar, or even identical, to those described in reference to FIGS. 3A-3H. Identical reference numbers are used to identify those operations and structures which are similar or even identical to those of FIGS. 3A-3H. In the interest of conciseness, only significant differences between the implementation of FIGS. 3A-3H and the implementation of FIGS. 6A-6I are discussed below.

Figure 6C:
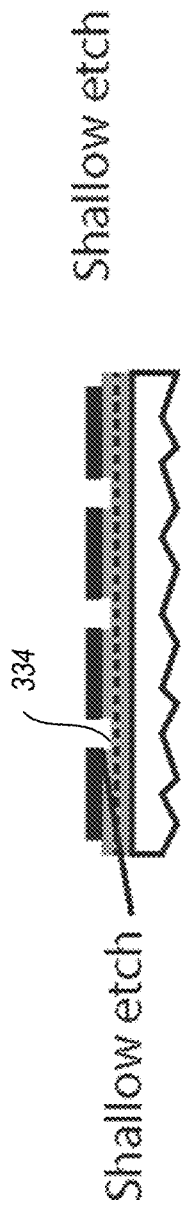
Figure 6D:
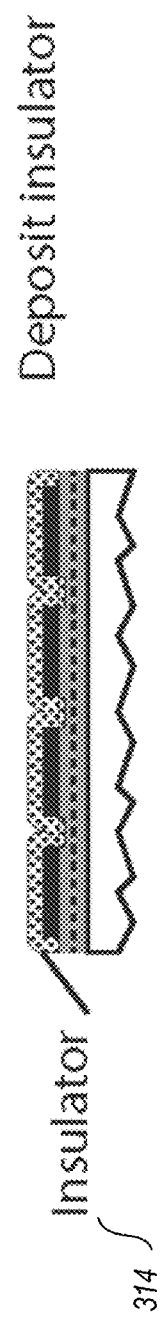
Figure 6E:
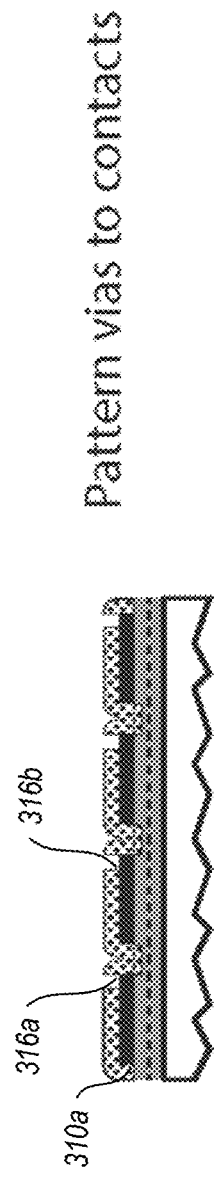
Figure 6F:
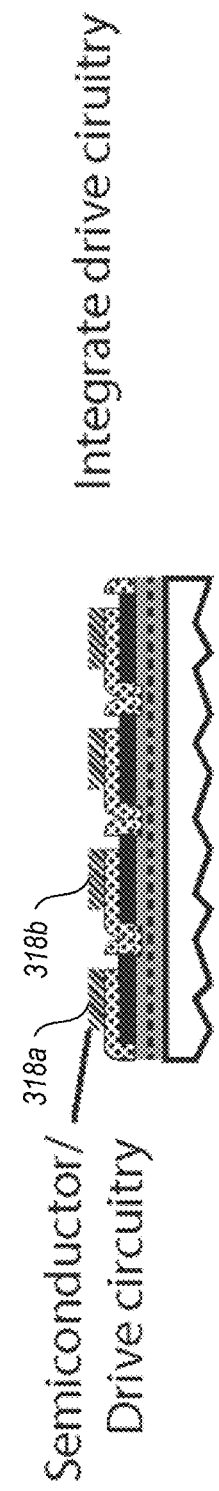
Figure 6G:
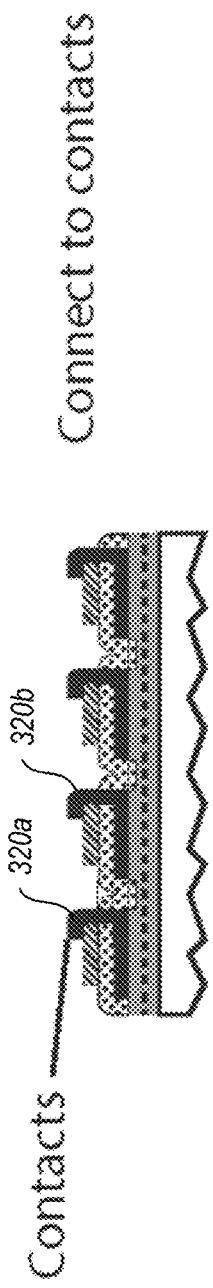
Figure 6H:
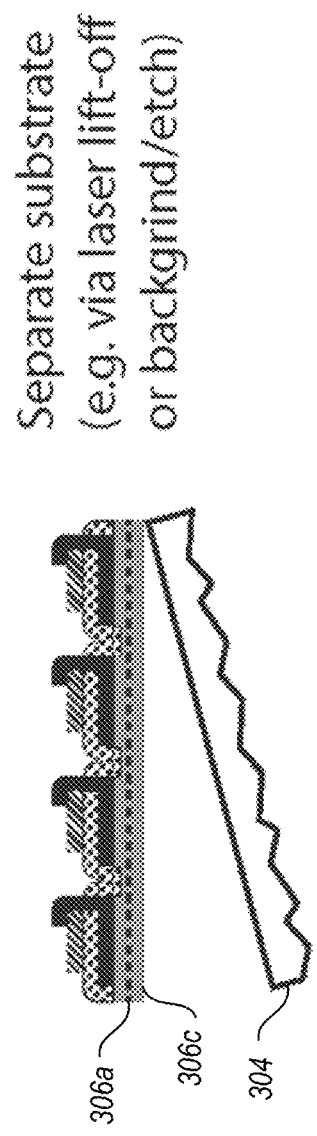
Figure 6I:
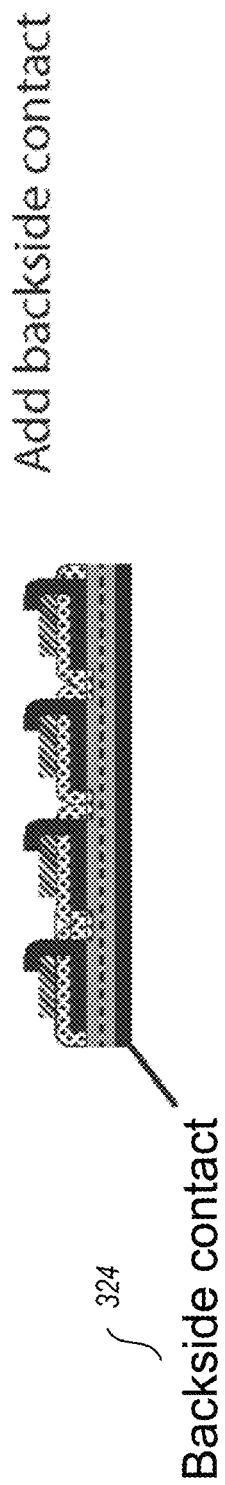

In contrast to the implementation illustrated in FIGS. 3A-3H, the implementation illustrated in FIGS. 6A-6I adds a shallow etch operation following the formation of the contacts 310 and before the depositing of the electrical insulator 314. For example, as best illustrated in FIG. 6C, a shallow etch is performed on the front or upper face 306b of the epitaxial layer 306, to form trenches 334 (only one called out) proximate or adjacent to an outer perimeter 336 (only one called out) of the contacts 310. Removal of material, for instance semiconductor material, from such areas can advantageously improve light extraction. This technique can be used with any one or more of the other implementations illustrated or described herein.

FIGS. 7A-7I illustrate a set of sequential operations of a fifth fabrication process to produce an LED structure 300e, according to at least one illustrated implementation which adds an electrical isolation enhancement operation (e.g., de-doping operation) to those of the first fabrication process to enhance electrical isolation.

Many of the operations and structures are similar, or even identical, to those described in reference to FIGS. 3A-3H. Identical reference numbers are used to identify those operations and structures which are similar or even identical to those of FIGS. 3A-3H. In the interest of conciseness, only significant differences between the implementation of FIGS. 3A-3H and the implementation of FIGS. 7A-7I are discussed below.

Figure 7A:
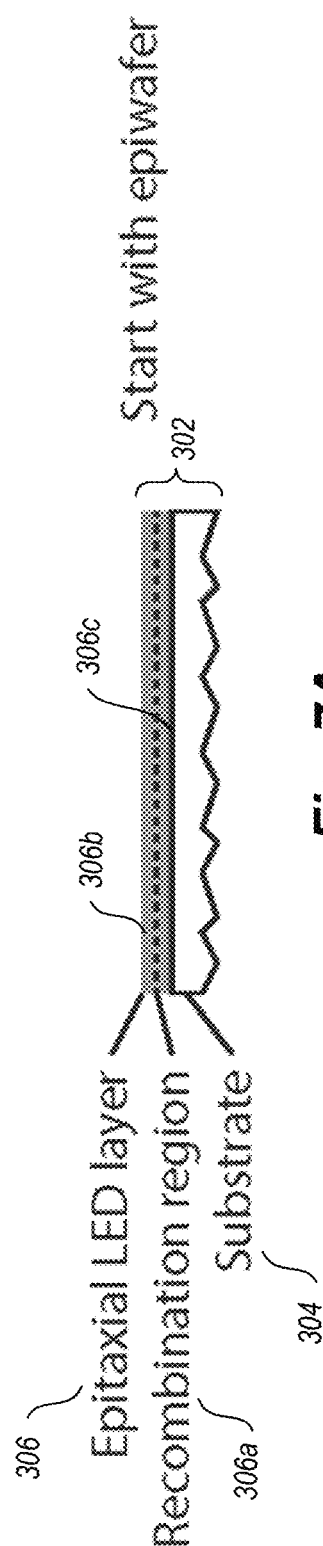
FIGS. 7A-7I are cross-sectional views illustrating sequential operations of a fifth fabrication process to produce an LED structure, according to at least one illustrated implementation which adds an electrical isolation enhancement operation (e.g., de-doping operation) to those of the first fabrication process to enhance electrical isolation.
Figure 7B:
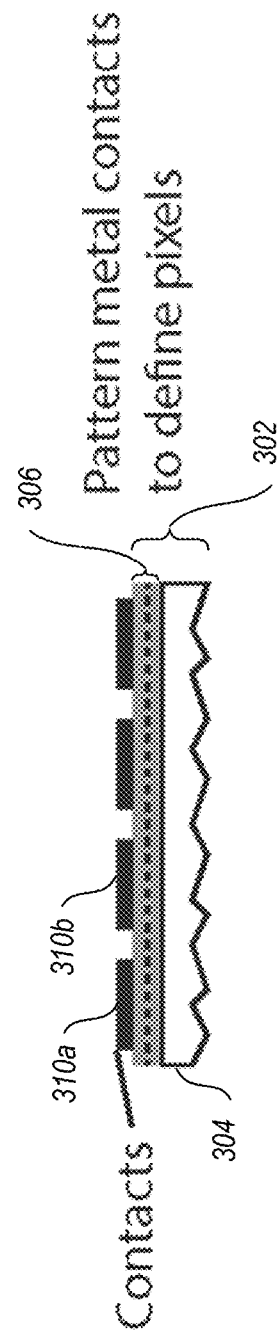
Figure 7C:
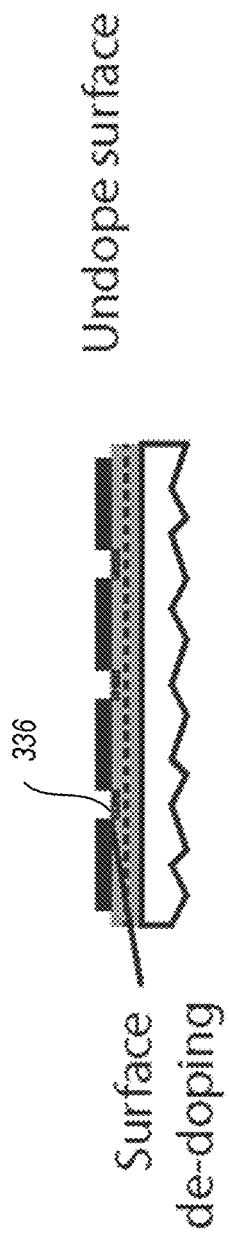
Figure 7D:
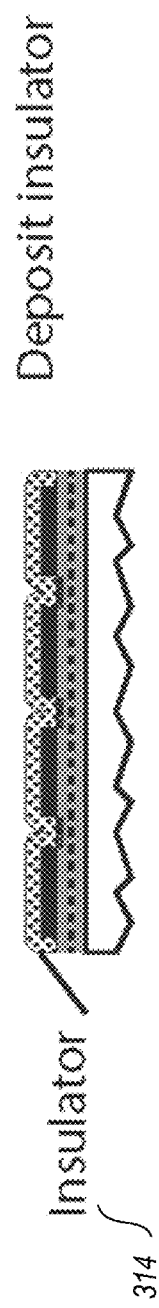
Figure 7E:
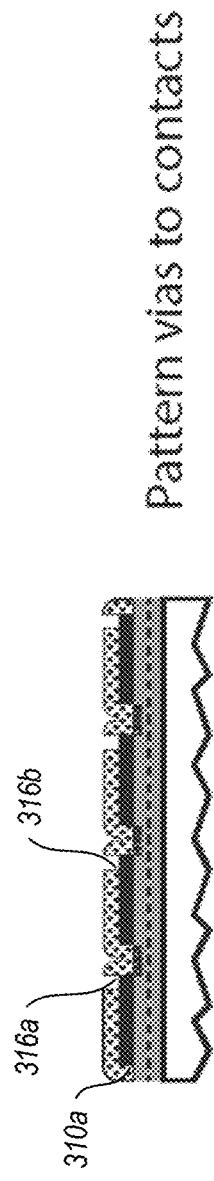
Figure 7F:
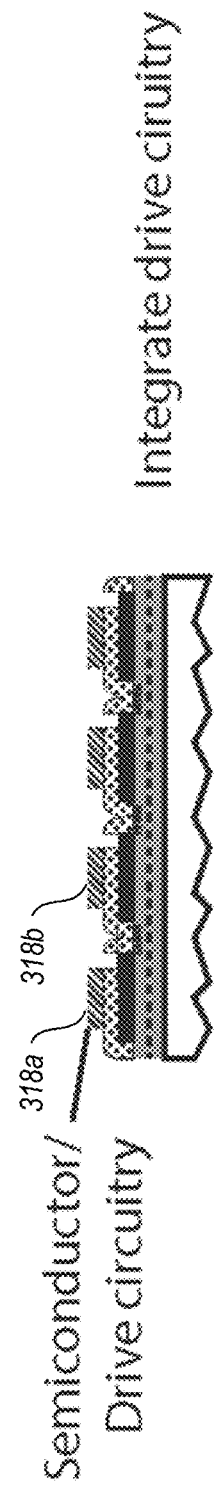
Figure 7G:
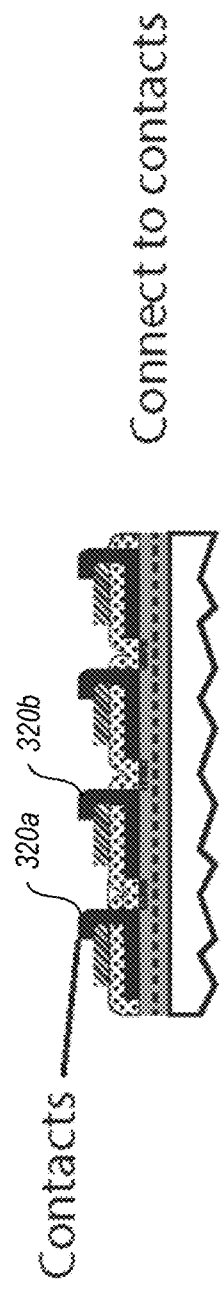
Figure 7H:
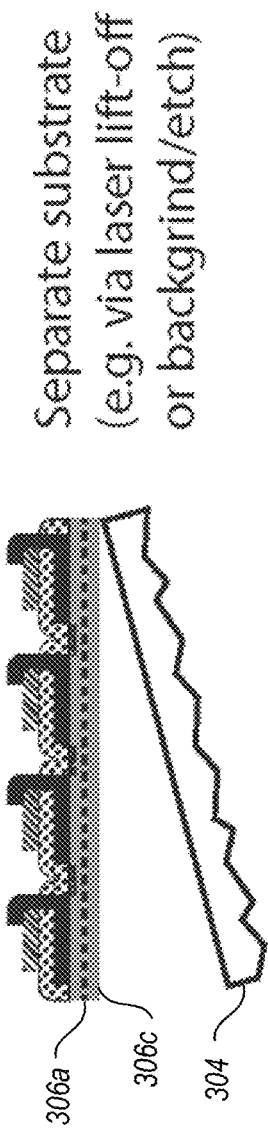
Figure 7I:
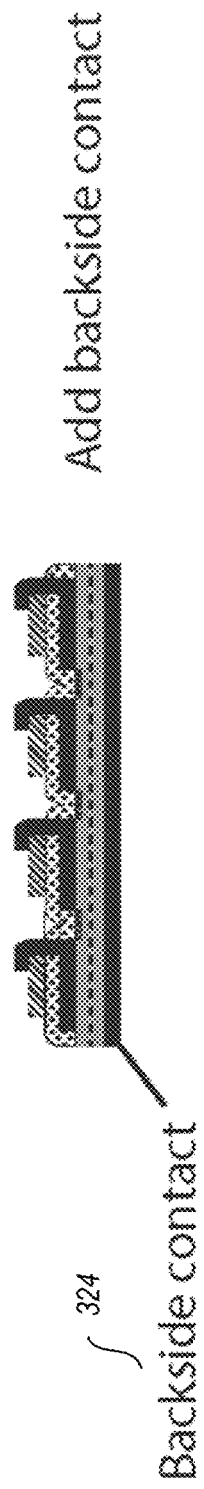

In contrast to the implementation illustrated in FIGS. 3A-3H, the implementation illustrated in FIGS. 7A-7I adds an electrical isolation enhancement operation, best illustrated in FIG. 7C.

The electrical isolation enhancement operation can take any or more of a variety of forms. For example, an area 336 (only one called out) proximate the contacts 310 may be de-doped (i.e., a region of previously doped material may be modified to no longer be doped, in contrast to an undoped region of material which has never been doped). Additionally or alternatively, a region (e.g., layer) of an electrically non-conductive material may be added, deposited or grown, for example via formation of an oxide, chloride, or other non-conductive layers, for example on the front or upper surface 306b of the epitaxial layer 306. For instance, reagents such as oxygen, sulfur, chlorine, bromine, fluorine, or iodine can be used to de-dope or otherwise reduce the electrical conduction of layers in an LED without creating an increased rate of recombination in the semiconductor material. These reactions, and/or shallow physical structuring, can be introduced using plasma treatment, exposure to liquid solvents, vapor treatment, hot wire activation, ion bombardment, or ion implantation.

This technique can be used with any one or more of the other implementations illustrated or described herein to produce or enhance electrical isolation. Patterning, etching, formation, and, or separation can employ any of a variety of integrated circuit fabrication techniques including, but not limited to, deposition (e.g., growing, coating, physical deposition, vapor chemical deposition, electro-chemical deposition, molecular beam epitaxy, atomic layer deposition), masking, etching (e.g., wet etching, dry etching), patterning or lithography operations (e.g., application of a photo-resist, curing portions of the photo-resist, and removing uncured portions of the photo-resist), chemical-mechanical planarization, and, or, doping, un-doping, or forming oxides.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to U.S. Provisional Application No. 62/676,172, are incorporated herein by reference, in their entirety. Aspects of the embodiments can be modified, if necessary, to employ systems, circuits and concepts of the various patents, applications and publications to provide yet further embodiments.

From the foregoing it will be appreciated that, although specific implementations and embodiments have been described herein for purposes of illustration, various modifications may be made without deviating from the spirit and scope of the teachings. Accordingly, the claims are not limited by the disclosed implementations and embodiments.

The invention claimed is:

1. A method of fabricating a light emitting diode (LED) structure, the method comprising:
    forming a set of contacts overlying a front surface of an epitaxial LED layer of a wafer, the wafer comprising a substrate and the epitaxial LED layer carried by the substrate;
    forming an insulator overlying the set of contacts;
    forming a plurality of throughholes that extend through the insulator to the contacts;
    integrating a set of drive circuits;
    connecting respective ones of the drive circuits to respective ones of the contacts by way of respective ones of a set of vias formed by the throughholes;
    removing one or more portions of the front surface of the epitaxial LED layer that is spaced laterally from any of the contacts; and
    forming at least one backside contact overlying the front surface of the epitaxial LED layer at one or more locations from which the one or more portions of the front surface of the epitaxial LED layer have been removed.

2. The method of claim 1 wherein forming a set of contacts overlying a front surface of an epitaxial LED layer of a wafer includes depositing a metal layer and patterning the metal layer.

3. The method of claim 1 wherein the wafer comprises a substrate and the epitaxial LED layer is carried by the substrate, and forming a set of contacts overlying a front surface of an epitaxial LED layer of a wafer includes forming the set of contacts directly on the front surface of the epitaxial LED layer.

4. The method of claim 1 wherein forming an insulator overlying the set of contacts includes depositing an insulative material to cover the set of contacts and to cover a portion of the front surface of the epitaxial LED layer that is exposed with respect to the contacts.

5. The method of claim 1 wherein forming at least one backside contact overlying the front surface of the epitaxial LED layer at that one or more locations from which one or more portions of the front surface of the epitaxial LED layer have been removed includes forming a ground plane that overlies at least one area of the front surface of the epitaxial LED layer exposed by the removal of the portion thereof.

6. The method of claim 1, further comprising:
    integrating one or more photonic crystal light extraction features.

7. The method of claim 1, further comprising:
    between forming the set of contacts and forming the insulator, undoping at least a portion of the front surface of the epitaxial LED layer to at least a nominal depth to improve isolation of the contacts.

8. The method of claim 7 wherein undoping at least a portion of the front surface of the epitaxial LED layer to at least a nominal depth includes exposing at least the portion of the front surface of the epitaxial LED layer to de-doping reagent.

9. A light emitting diode (LED) structure, comprising:
    a wafer comprising an epitaxial LED layer, the epitaxial LED layer having a front surface;
    a set of contacts overlying one or more portions of the front surface of the epitaxial LED layer;
    an insulator overlying the set of contacts;
    a plurality of throughholes that extend through the insulator to respective ones of the contacts;
    a set of drive circuits;
    a set of electrically conductive paths that connect respective ones of the drive circuits to respective ones of the contacts by way of respective ones of a set of vias formed by the throughholes and the electrically conductive paths; and
    at least one backside contact overlying a portion the front surface of the epitaxial LED layer and that extends along two or more of the contacts.

10. The LED structure of claim 9 wherein the epitaxial LED layer has a back surface, the back surface opposed across the wafer from the front surface thereof, and the wafer omits a substrate to expose the back surface of the epitaxial LED layer.

11. The LED structure of claim 10 further comprising:
    one or more light extraction features integrated on the back surface of the epitaxial LED layer exposed by the separation of the substrate therefrom includes forming photonic crystal.

12. The LED structure of claim 11 wherein at least a portion of the at least one backside contact overlies at least a portion of one or more light extraction features on the back surface of the epitaxial LED layer exposed by the separation of the substrate therefrom.

13. The LED structure of claim 9, further comprising:
    a number of shallow trenches etched into portions of the front surface of the epitaxial LED layer to improve light extraction.

14. The LED structure of claim 9 wherein the at least one backside contact is a ground plane that overlies at least a majority of the back surface of the epitaxial LED layer.

15. The LED structure of claim 9 wherein at least the front surface of the epitaxial LED layer is devoid of imperfections that would otherwise result from deep etching.

16. A method of fabricating a light emitting diode (LED) structure, the method comprising:
    forming a set of contacts overlying a front surface of an epitaxial LED layer of a wafer, the wafer comprising a conductive substrate and the epitaxial LED layer carried by the substrate;
    forming an insulator overlying the set of contacts;
    forming a plurality of throughholes that extend through the insulator to the contacts;
    integrating a set of drive circuits;
    connecting respective ones of the drive circuits to respective ones of the contacts by way of respective ones of a set of vias formed by the throughholes; and
    connecting the conductive substrate to respective ones of a plurality of LEDs defined in the epitaxial LED layer.

17. The method of claim 16 wherein forming a set of contacts overlying a front surface of an epitaxial LED layer of a wafer includes depositing a metal layer and patterning the metal layer.

18. The method of claim 16 wherein the wafer comprises a substrate and the epitaxial LED layer is carried by the substrate, and forming a set of contacts overlying a front surface of an epitaxial LED layer of a wafer includes forming the set of contacts directly on the front surface of the epitaxial LED layer.

19. The method of claim 16 wherein forming an insulator overlying the set of contacts includes depositing an insulative material to cover the set of contacts and to cover a portion of the front surface of the epitaxial LED layer that is exposed with respect to the contacts.

* * * * *